Feb. 10, 1970 A. L. TYLER 3,494,017

METHOD OF MOUNTING BEAM LEAD SEMICONDUCTOR DEVICES FOR PRECISION SHAPING

Filed Sept. 29, 1967 2 Sheets-Sheet 1

INVENTOR
A. L. TYLER
BY H. W. Lockhart
ATTORNEY

FORCE AND TIME REQUIRED TO ATTAIN
0.1 MIL FILM THICKNESS (1.0 IN. DIA. SLICE)

United States Patent Office 3,494,017

Patented Feb. 10, 1970

3,494,017

METHOD OF MOUNTING BEAM LEAD SEMICONDUCTOR DEVICES FOR PRECISION SHAPING

Austin L. Tyler, Allentown, Pa., assignor to Bell Telephone Laboratories, Incorporated, Murray Hill and Berkeley Heights, N.J., a corporation of New York Filed Sept. 29, 1967, Ser. No. 671,719
Int. Cl. B23q 7/00; B01j 17/00
U.S. Cl. 29—424 6 Claims

ABSTRACT OF THE DISCLOSURE

In the fabrication of semiconductor integrated circuits of the type using dielectric isolation, precision mounting for polishing and precision etching is achieved using a mounting medium based on a polybutadiene styrene resin. The mounting medium is applied using a two-step procedure including a carefully controlled force-time sequence followed by a curing cycle in order to attain the desired precise mounting medium thickness.

BACKGROUND OF THE INVENTION

Field of the invention

The mounting of semiconductor slices and other semiconductor bodies for processing operations is an important part of semiconductor device fabrication. As semiconductor devices, particularly the integrated type, become more complex, greater precision and more stringent physical standards are required in the mounting process. In particular, it is often important that the semiconductor body be mounted so that a polishing process to reduce the thickness of a wafer will produce a body of uniform dimensions within precise limits.

Description of the prior art

Various adhesives have been used in the past to mount semiconductor bodies for processing. In many instances simple adherence and relative ease of removal were the only criteria in selecting a mounting medium. However, with the development of semiconductor integrated circuits, particularly those involving dielectric isolation and therefore requiring precise through-separation of portions of the semiconductor body, preciseness in the location and preparation of surfaces of the body are required. Accordingly, the material used for mounting must be amenable to these mounting requirements and, as well, must be compatible with the variety of reagents used for polishing and etching. Finally, the mounting material should be readily removable without damage to the device structures and with a minimum of residue.

SUMMARY OF THE INVENTION

In accordance with the invention semiconductor slices, for example, of the silicon beam lead, air isolated monolithic (AIM) type, are precisely mounted using a two step process for applying a mounting material based on a polybutadiene styrene resin for mounting the slice to a mounting member.

A first layer of the mounting material is applied using a nonadherent member to flatten and spread the material on the front or beam lead face of the silicon slice to a thickness equal to that of the beam leads. This initial layer then is cured and a second layer is applied. The second layer is formed using a rigid flat mounting member having a contact face of improved adherence to the mounting material. A known force is applied through the mounting member for a prescribed time so as to compress the second layer to a particular predetermined thickness, typically of the order of 0.1 mil. The particular force-time parameters have been determined to be a function of, primarily, the viscosity of the mounting material and the area of the device surface.

By following this particular technique, the mounting member ultimately attains a position substantially parallel to the beam leaded face of the semiconductor body. The assembly then is subjected to a heating cycle which cures the resin and enhances adhesion between the mounting material and the contact face of the mounting member. After this curing step, the semiconductor body is ready for further processing including polishing and etching of the exposed back surface.

Typically, the back surface of the semiconductor body is mechanically lapped and polished to reduce the thickness of the body and at the same time to produce a body of uniform thickness. Accordingly, in order to produce a semiconductor body of uniform thickness it is important that the opposing major surfaces of the body be parallel and thus one basis of the method in accordance with the invention is the mounting of the body so that the front or beam leaded face is parallel to the mounting member. Thus, the forming of the mounting material to a precise uniform thickness is most important.

Accordingly, one particular feature of the invention is the application of a known force for a particular time related to the viscosity of the mounting material and the area of the body, so as to achieve a prescribed uniform thickness of the mounting material. A further feature is a mounting material based on a polybutadiene styrene resin which has advantageous flow characteristics, adhesion, and chemical resistance properties.

DESCRIPTION OF THE DRAWING

The invention and its objects and other features will be more clearly understood from the following detailed description taken in conjunction with the drawing in which

Referring to the drawing, FIG. 1 shows the initial step in the mounting process. A semiconductor slice 11 has a series of deposited metal leads on the upper surface thereof. It will be understood that the slice 11 is representative of a variety of structures which may be processed as described herein. For example, the semiconductor slice 11 may include a plurality of discrete devices such as transistors which are to be precisely separated. Or the slice may comprise a plurality of integrated circuit devices which are to be separated into individual circuits while simultaneously the beam lead supported elements are etched to provide dielectric isolation. In any case, it is important to so mount the slice to enable precise mechanical polishing of the back or nonleaded surface using a suitable medium. Metal leads 12 are of a standard thickness used to provide interconnections for the integrated circuit devices, while the thicker leads 13 comprise the supporting beam leads as disclosed in U.S. Patent 3,335,338, granted Aug. 8, 1967 to M. P. Lepselter. On this beam lead surface a quantity 14 of a mounting material including a polybutadiene styrene resin is placed and a disk 16 of sapphire and a Teflon separator 17 are positioned above the semiconductor body.

Figure 1:
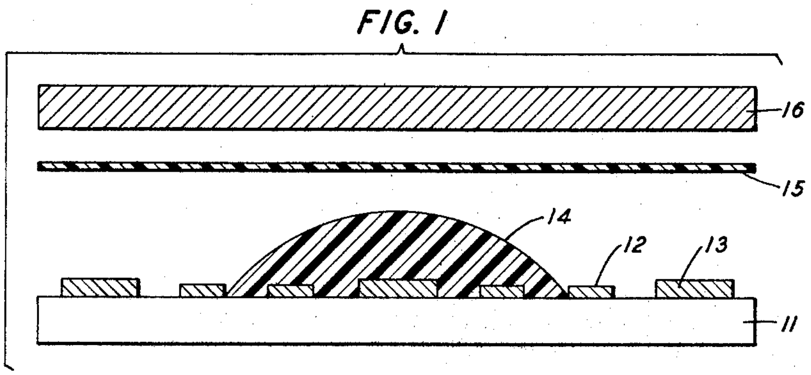
FIGS. 1 through 4 show in cross-sectional views, the sequence of steps of a mounting procedure in accordance with the invention.
Figure 2:
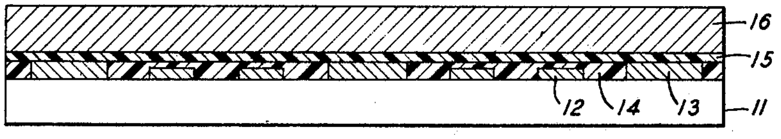

Then as shown in FIG. 2 the disk 16 and separator 17 are forced against the beam leaded surface of the semiconductor slice so as to compress the mounting material to a thickness no greater than that of the beam leads 13. In connection with this initial application step it is important to appreciate that some shrinkage of the mounting material occurs during the subsequent curing or hardening step, and, therefore, it is important to avoid the entrapment of air bubbles in or under the material. In one specific process, using a 1 mil thick Teflon film and a one inch diameter slice, a weight of approximately 10 pounds or about 12.76 pounds per square inch was applied. The mounting material then is cured in a nitrogen atmosphere at about 200 degrees centigrade for about two hours. During this curing step shrinkage causes the mounting material in contact with the Teflon film to pull away, but the portion in contact with the semiconductor slice surface remains bonded to that surface. After the curing the Teflon spacer is removed easily from the mounting material leaving the semiconductor device coated to a depth substantially equal to the thickness of the beam leads with a hard, well-bonded layer 14.

Figure 3:
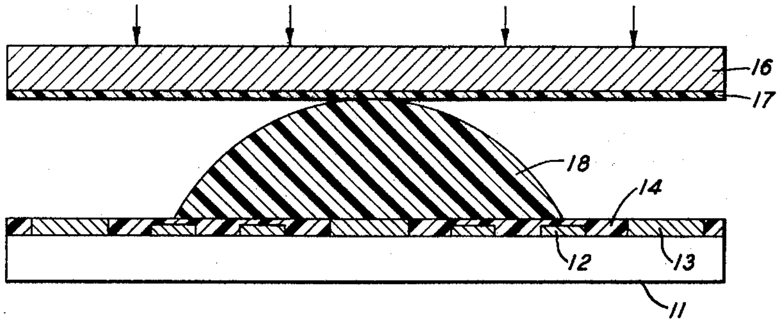
Figure 4:
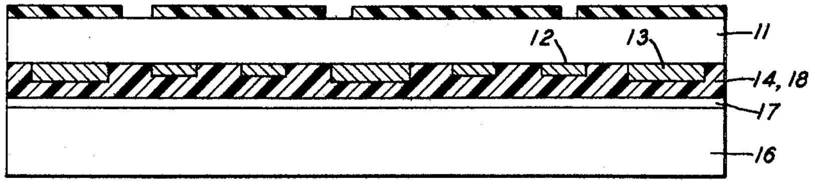

Referring to FIG. 3 the mounting process is continued with the application of another quantity of mounting material 18. However, in place of the Teflon spacer 15 the mounting disk 16 in this step is coated with a film 17 of silicon dioxide. Typically, this silicon dioxide coating is from 2000–3000 A. thick and produces a much better adhesion of the mounting material to the disk 16 which will comprise the mounting member. Again, the disk 16 compresses the material 18 to a thin layer, as shown in FIG. 4, in which both the initial layer 14 and the final or upper layer 18 are shown as a single coating 14, 18.

Figure 6:
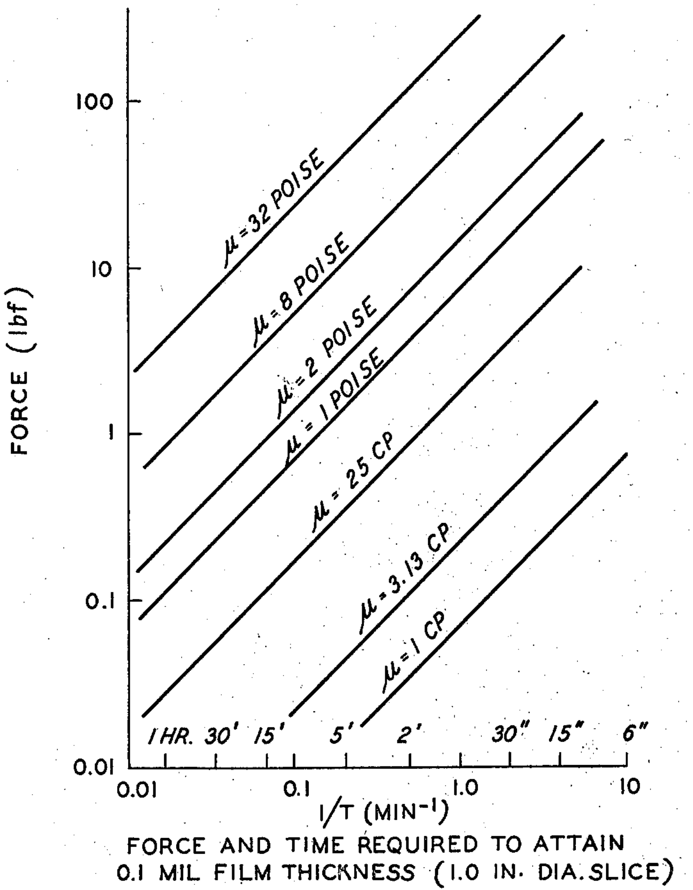

However, the achievement of a layer having a uniform thickness of the order of 0.1 mil between the upper face of the beam leads 13 and the contact face of the disk 16 is, for a particular mounting material, a function of the amount of force and the time during which it is applied and the area of application. In particular, referring to the graph of FIG. 6 the force and time required to attain a 0.1 mil film thickness of a one inch diameter slice is determinable as a function of the viscosity of the mounting material used. One particular embodiment which has been successfully employed utilizes a material composed of the following components:

| | | |
|---|---|---|
| Butadiene-styrene resin (Buton-100 Resin-Enjay Chemical Co.) | wt. percent | 70 |
| Vinyl tulene | wt. percent | 30 |
| γ-Methacryloxypropylthimethoxysilane parts per 100 parts resin p.h.r.) (Dow Corning Z-6030 silane) | parts | 1.0 |
| 2,5 dimethyl-2,5-bis (t-butyl peroxy) hexane (Lupersol 101-Wallace & Tierman, Inc.) | p.h.r. | 5 |

This material has a viscosity of about 8–10 poise. Referring to the graph of FIG. 6, it is indicated that a period of 6–7 minutes under 10 lbf. load will compress the mounting medium to the desired thickness.

Figure 5:
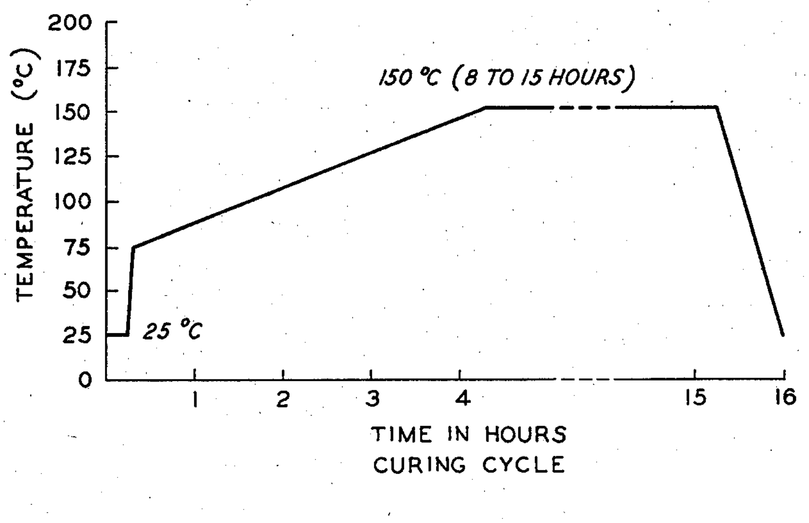
FIG. 5 is a graph showing the heat treatment cycle for curing the mounting material and FIG. 6 is a graph showing the force-time relation for various viscosities of mounting material to achieve a film thickness of 0.1 mil on a one inch diameter semiconductor slice.

Following this application of the second layer 18 the assembly is subjected to a curing cycle by heating at the temperatures and for the times as indicated in the graph of FIG. 5. The part of the heating cycle subsequent to the rise to 75 degrees centigrade has been found to be most advantageous in obtaining uniform adhesion between the mounting material and the silicon dioxide coated mounting member 16. Temperature excursions which are relatively rapid result in failure of the bond at the interface between the mounting material 14, 18 and the mounting member 16.

The mounting material is most advantageous for use with potassium hydroxide-alcohol etching systems of the type disclosed in the application of R. C. Kragness and H. A. Waggener, Ser. No. 603,292, filed Dec. 20, 1966 and assigned to the same assignee as this application. Moreover, this material, when cured, forms a polymer which is unusually resistant to chemical attack by strong acids, bases and organic solvents.

It is posible to use subtantially any relative proportion of the ingredient set forth up to 50% vinyl toluene. The choice of a specific composition is determined by the viscosity required for precise mounting and the chemical resistance and hardness required during subsequent processes. It should be pointed out that increasing the vinyl toluene content necessitates a signficantly longer curing time and increased organic peroxide concentrations to produce an equivalent cured mounting material.

In connection with this application of force to the mounting member 16 it is important that a method be employed to insure the precisely parallel position of the contact face of the mounting member with respect to the beam leaded surface of the semiconductor device. It is, of course, important that the mounting disks themselves have flat precisely parallel major faces. Suitable disks may be made of sapphire in order to combine the desirable qualities of high strength, chemical resistance and the ability to transmit infrared light to facilitate the alignment of masks on the back surface of the semiconductor body. Electron gun evaporation techniques provide a convenient method for applying the silicon dioxide coating 17 to the contact face of the mounting member.

Finally, after the lapping, polishing and etching processes, which are not a part of this invention, but which are disclosed in the above-identified application of Kragness and Waggener, the mounting material is readily removed by exposing the assembly to oxygen containing ozone. The ozone treatment results in a gaseous product which is readily removed and the end result is a semiconductor slice having little or no residue.

Although the invention has been disclosed in terms of a specific embodiment, it will be understood other arrangements may be devised by those skilled in the art which likewise fall within the scope and spirit of the invention.

What is claimed is:

1. In the fabrication of a semiconductor device the technique of temporarily mounting a semiconductor body for processing by adhering the semiconductor body to a mounting member by means of a thin uniform layer of a mounting material comprising the steps of applying to one face of the semiconductor body a quantity of a mounting material, forming said mounting material to a thin uniform layer of predetermined thickness by applying the mounting member to said material with a known force for a time related to the viscosity of the material and the area of the face of the semiconductor body, said mounting material being applied in two successive steps including a heating step after each application.

2. The process in accordance with claim 1 in which the mounting material substantially comprises a polybutadiene styrene resin.

3. The process in accordance with claim 1 in which a film of silicon dioxide is formed on the contact face of the mounting member prior to applying it to the mounting material.

4. In the process of fabricating a semiconductor integrated circuit device having beam leads on one face thereof the steps of applying on said beam leaded face a first layer of a mounting material, said layer having a thickness approximately equal to the thickness of the beam leads, heating the semiconductor body to harden the mounting material, applying a second layer of said material on said first layer, applying a mounting member using a known force for a time related to the viscosity of the material and the area of the semiconductor surface to form said second layer to a uniform, desired thickness, and heating said semiconductor body to harden said second layer of mounting material.

5. The method in accordance with claim 4 in which said mounting member has a film of silicon dioxide on the face contacting the mounting material to enhance the adherence thereof.

6. The method of fabricating a beam lead semiconductor device having air isolation including the steps of applying a first uniform layer of a mounting material including a polybutadiene resin to the beam leaded face of a semiconductor body, curing said first layer, applying a second layer of said mounting material, contacting said second layer with a mounting member having a coating of silicon dioxide on the contacting face thereof, applying a force to said member for a time, related to the viscosity of said mounting material, sufficient to form said second layer to a prescribed thickness of the order of 0.1 mil, heating said body and member at a temperature and for a time sufficient to cure and adhere the second layer to the mounting member, inverting said body and member, polishing the reverse face of said semiconductor body, and forming an etch resistant mask on the reverse face.

References Cited

UNITED STATES PATENTS

| | | | |
|---|---|---|---|
| 2,984,897 | 5/1961 | Godfrey | 29—424 X |
| 3,078,559 | 2/1963 | Thomas | 29—424 X |
| 3,158,927 | 12/1964 | Saunders | 29—424 X |
| 3,226,804 | 1/1966 | Hasenclauer | 29—589 X |
| 3,417,454 | 12/1968 | Beasley | 29—559 X |

PAUL M. COHEN, Primary Examiner

U.S. Cl. X.R.

29—559, 576, 580